United States Patent [19]

Spinelli et al.

[11] Patent Number: 4,706,812

[45] Date of Patent: Nov. 17, 1987

[54] SHIPPING AND DISPENSING PACKAGE FOR A SERIES OF ARTICLES

[75] Inventors: Thomas S. Spinelli, Attleboro; Edward J. Deras, Sutton, both of Mass.

[73] Assignee: Texas Instruments Incorporated, Dallas, Tex.

[21] Appl. No.: 449,082

[22] Filed: Dec. 13, 1982

[51] Int. Cl.⁴ ..................... B65D 75/00; B65D 85/30
[52] U.S. Cl. ................................. 206/332; 206/334; 206/338
[58] Field of Search ................. 206/328–332, 206/334, 338, 340; 361/220

[56] References Cited

U.S. PATENT DOCUMENTS 1,827,315 10/1931 Hallen .................................. 206/340
4,037,267 7/1977 Kisor .................................... 206/331

FOREIGN PATENT DOCUMENTS 0001123 12/1979 PCT Int'l Appl. .................. 206/334

Primary Examiner—Jimmy G. Foster
Attorney, Agent, or Firm—James P. McAndrews; John A. Haug; Melvin Sharp

[57] ABSTRACT

A package for shipping and dispensing articles such as integrated circuit mounting sockets or the like comprises an extruded, open-ended plastic tube having a reentrant rib formed along one tube side so that the interior tube chamber accommodates the bifurcated lateral outlines of such i.c. sockets in side-by-side serial relation to each other inside the tube with the socket bodies resting on the rib and with the socket terminals suspended and protected on either side of the rib. Segments of the tube material extending around part of the tube periphery near each end of the tube are separated from the tube material along the two opposite sides of each segment and are integrally attached to the tube material at the two opposite ends of the segments, the segments having plastic materials in the end portions of the segments deformed beyond the elastic limit of the tube materials so that the segments are reliably positioned to extend across the tube chamber with one of the sides of each segment disposed to intercept socket bodies inside the chamber and with the widths of the segments oriented to be generally parallel to the tube axis for positively blocking dispensing of sockets from open ends of the tube, the segments each being adapted to be selectively moved out of the tube chamber with a tool for permitting reliable and free dispensing of sockets from an open tube end.

4 Claims, 4 Drawing Figures

SHIPPING AND DISPENSING PACKAGE FOR A SERIES OF ARTICLES

BACKGROUND OF THE INVENTION

The field of this invention is that of shipping packages, and the invention relates more particularly to packages for shipping and dispensing a series of integrated circuit mounting sockets or the like.

Integrated circuit mounting sockets typically have contacts mounted in a socket body to connect to integrated circuit terminals inserted into body openings at one side of the body and have terminal posts extending from the contacts in two rows at the opposite side of the body to be connected to circuit means on printed circuit boards and the like. Such sockets are conventionally loaded for shipment in serial relation to each other inside a low cost, open-ended, extruded plastic tube which has a reentrant rib formed along the length of the tube so that the socket bodies rest on the rib and so that the rows of contact terminal posts are suspended in protected relation on respective sides of the rib. Means are arranged in the open tube ends to retain sockets in the tube during shipment and are adapted to be subsequently removed from the tube ends for permitting the sockets to be dispensed or fed in sequence from an open end of the tube into automatic socket mounting equipment or the like for mounting on circuit boards. Such packages are also used for shipping and dispensing integrated circuit units themselves. As manufacture, shipping and assembly of such sockets on circuit boards and the like become increasingly automated, the costs of loading, shipping, and unloading sockets from the shipping tubes becomes of increasing significance and some problems have been encountered in assuring proper protection for the sockets during shipping while also permitting economical loading and unloading of sockets from such tubular packages. In one known system for example, tabs are struck or separated from the extruded tube material along three sides of the tab and the tabs are hinged along fourth sides near each end of the tube so that the distal ends of the tabs incline down into the tube chamber and incline toward each other from opposite ends of the tubes for intercepting and holding sockets in serial relation to each other inside the tubes. In that system, some difficulty is encountered in forming the tabs after loading sockets into the tube without injuring the sockets; the tabs do not provide a great degree of reliable support to assure that heavier sockets or integrated circuit units do not slide out of the tubes during shipment or particularly during handling; and when a tab is subsequently bent back out of the tube to allow the sockets to be dispensed from an open tube end, the tab is not assuredly removed from the tube chamber to assure free feeding of sockets from the tube. Another tubular package system has plastic pins or rivets detachably fitted into ends of the tubes to extend across the tube ends for retaining the sockets or the like within the tubes during shipping. Such pins or rivets provide firmer and more reliable retention of sockets within the tubes during shipment but add both material cost and cost of inserting the pins and of removing and disposing of the pins when the sockets are subsequently removed from the tubes after shipment.

SUMMARY OF THE INVENTION

It is an object of this invention to provide a novel and improved shipping and dispensing package for series of articles; to provide such an improved tubular package which is inexpensive, which is easily and reliably loaded with integrated circuit mounting sockets and the like, which provides good support and protection for the sockets during shipment, and which is easily and reliably adapted for selectively dispensing sockets from an open end of the tubular package.

Briefly described, the novel and improved shipping and dispensing package comprises an extruded open-ended plastic tube having a reentrant rib formed along one tube side so that the interior tube chamber accommodates the bifurcated lateral outline of integrated circuit mounting sockets and the like in side-by-side serial relation to each other within the tube with the socket bodies resting on the rib and with the socket terminals suspended from the socket bodies and protected on either side of the rib. Segments of the tube material extending around part of the tube periphery near each end of the tube are separated from the tube material along two opposite sides of each segment and the segments are each integrally attached to the tube material at both of the opposite ends of the segments. The segments have plastic materials in the end portions of the segments deformed beyond the elastic limit of the tube material so that the segments are reliably positioned to extend across the tube chamber with one of the sides of each segment disposed to intercept socket bodies inside the tube chamber and with the widths of the segments oriented to be generally parallel to the tube axis. In that arrangement the segments positively block dispensing of sockets from open ends of the tube during shipment of the tubes loaded with sockets but the segments are each adapted to be selectively moved out of the tube chamber with a tool for permitting reliable dispensing of the sockets from an open tube end.

DESCRIPTION OF THE DRAWINGS

Other objects, advantages and details of the novel and improved shipping and dispensing package of this invention appear in the following detailed description of preferred embodiments of the invention, the detailed description referring to the drawings in which.

DESCRIPTION OF THE PREFERRED EMBODIMENTS

Figure 1:
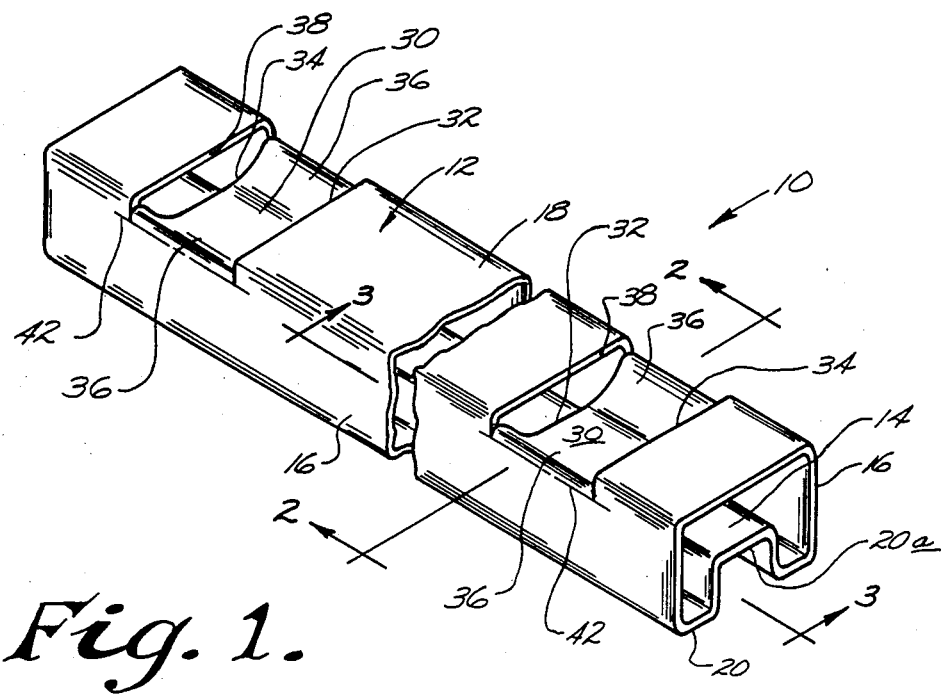
FIG. 1 is a perspective view of the improved package of this invention.
Figure 2:
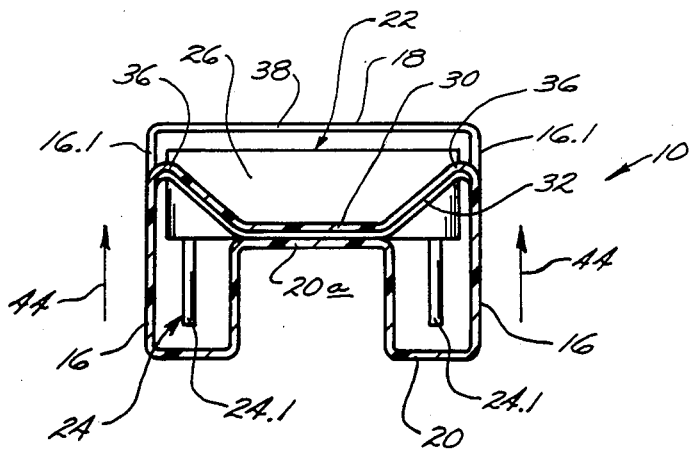
FIG. 2 is a section view to enlarged scale along line 2—2 of FIG. 1.
Figure 3:
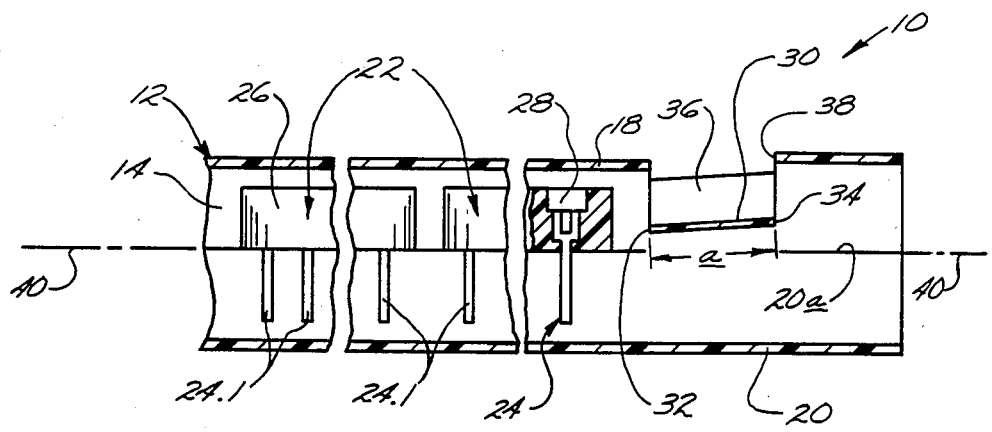
FIG. 3 is a partial section view to enlarged scale along line 3—3 of FIG. 1.

Referring to the drawings, 10 in FIGS. 1-3 indicates the novel and improved package of this invention which is shown to comprise a shape-retaining, open-ended tube 12 of a synthetic plastic material such as polyvinyl chloride, polyethylene terephthalate, or acrylonitrile-butadiene-styrene or the like. Preferably the tube is formed by low cost extrusion and the tube walls preferably have a substantially uniform thickness. However portions of the tube wall extending along the length of the extruded tube can also be made thicker where desired within the scope of this invention. The peripheral cross-section of the tube defines a tubular chamber 14 and preferably has two opposite, facing sides 16 disposed in rectilinear relation to a third side 18 and has a fourth reentrant side 20 forming an inturned, channel-shaped rib 20a which extends along the length of the tube. In that arrangement, the tubular package chamber 14 is particularly adapted to be loaded with a series of conventional integrated circuit unit mounting sockets, or other articles such as integrated circuit units themselves of similar shape, in side-by-side relation to each other inside the tube to protect the articles during shipment or the like and to permit the sockets to be subsequently dispensed in sequence with the selected orientation of the sockets in space from an open end of the tube. That is, such i.c. mounting sockets 22 typically have a plurality of very thin and easily bent electrical contacts 24 mounted in a socket body 26 of a rigid electrical insulating material. The contacts are adapted to connect to integrated circuit terminals inserted into openings 28 at one side of the body and have terminal 24.1 extending in two rows from an opposite side of the body. The i.c. sockets therefor have a bifurcated lateral outline and the cross-section of the tubular chamber 14 generally conforms to that outline so that the sockets are accommodated within the chamber 14 in side-by-side series relation to each other with the socket bodies resting on the rib 20a and with the rows of contact terminal posts 24.1 suspended from the socket bodies on respective opposite sides of the rib to be protected while within the tube chamber.

In accordance with this invention, integral segments 30 of the tube material which extend peripherally around a part of the tube periphery adjacent to but slightly spaced from respective tube ends are separated from the tube material along two opposite sides 32, 34 of the segments and are integrally attached to the tube material at the opposite ends 36 of each segment. Each segment is deformed out of the original configuration of the tube periphery to leave an opening 38 in the tube periphery and to dispose the segment so that it extends across the tubular chamber 14 with one side of each segment arranged to intercept movement of the sockets or other articles 22 inside the tube and with the widths a of the segments oriented so that they are generally parallel to the central, longitudinal axis of the tubular chamber 14 as indicated at 40 in FIG. 3. Preferably, although the widths of the segments are oriented generally parallel to the noted axis 40 the segment sides 32 are preferably disposed slightly closer to the rib 20a than the segment side 34 for purposes to be noted below. In accordance with this invention, the end portions 36 of the segments 30 are preferably deformed so that the plastic material of the tube is stretched and elongated beyond its elastic limit within said segment end portions. Preferably, each segment also embodies the length of the third side 18 of the tube periphery as well as portions 16.1 of each of the two sides 16 of the tube periphery. Preferably the segments are attached to the tube sides 16 along hinge locations 42 and incline in one general direction down into the tubular chamber 14 while the two sides 16 of the tube periphery extend generally in an opposite direction to provide columnar support for the segments at the hinge locations as is diagrammatically indicated in FIG. 2 by the arrows 44.

Figure 4:
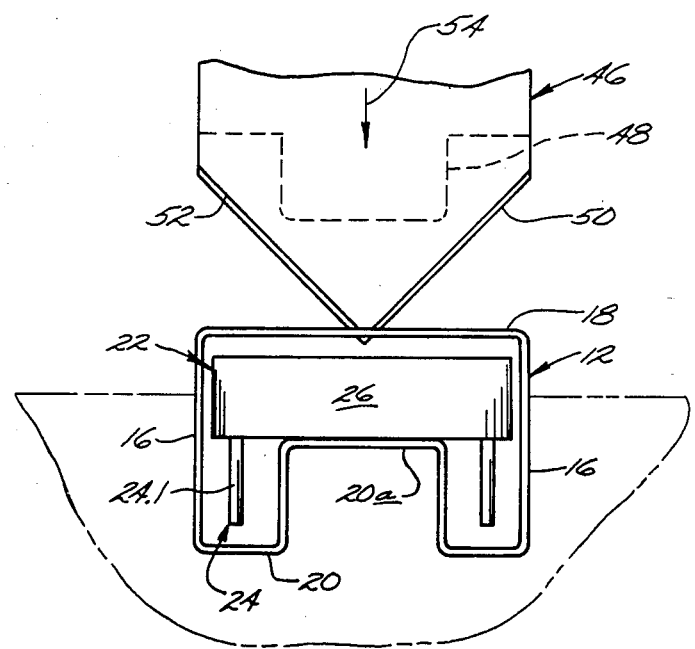
FIG. 4 is a diagrammatic section view similar to FIG. 2 illustrating steps in formation of the package of FIG. 1.

In accordance with this invention, the segment structure as above described is economically provided using a tool 46 as indicated in FIG. 4 comprising a die block 48 having a long V-tapered cutting blade 50 at one end of the die block and having a shorter V-shaped cutting block 52 at an opposite end of the block (the foreground end of block as illustrated in FIG. 4). The tool is used for forming one segment 30 at one end of the tube 12 before the sockets 22 are loaded into the tube to rest against that segment. A second segment 30 is then formed in the tube near the opposite end of the tube for securing the sockets within the tube during shipment. In forming that latter segment for example, the tool 46 is advanced downward toward the tube 12 in the direction of arrow 54 as illustrated in FIG. 4. The V-shaped blade 50 initially pierces the tube side 18 and opens a slit which extends outwardly toward tube sides 16 to define the side 32 of the segment 30. The blade 54 then pierces the tube side 18 to form a second slit and define the segment side 34. The die block 48 then engages the side 18 and begins to stretch and elongate the plastic material of the tube at the ends 36 of the segments 30. The columnar disposition of the tube sides 16 support the segments 30 to permit such deformation of the tube material as the cutting blades 52 and 54 then slit the sides 16 down to the hinge locations 44.

In that arrangement, the segments 30 are deformed into the tubular chamber and, because of elongation of the segment ends, tend to remain extending across the chamber for retaining the articles 22 within the tube. That is, the permanent deformation of the tube material tends to prevent movement of the segments back out of the chamber 14 due to material memory or the like such as might occur if the segments were merely bent into the chamber. The widths A of the segments are oriented generally parallel to the axis of the tube so that the full width of the segments support the segments against the weight of the series of articles 22 loaded within the tube even if the tube is held vertical so that the full weight of the articles rests on the segments. Further, if the segment edges 32 are slightly closer to the rib 20a as is preferred, the weight of the articles is even more positively caught and held by the segments as some locking rotation of the segments tends to occur as will be understood. As the segments are formed with double piercing blades 52, 54, the segments 30 are spaced from the tube ends and are not likely to be bent out of place during shipment or handling of the loaded tubes. The deformation of the segment ends also occurs without tending to collapse the tube out of its original cross section in the zone of the segments and without tending to crush the terminals of sockets immediately adjacent to the segments being formed. Accordingly, the sockets are protected against injury during formation of the segments. The segment is then easily moved out of the tubular chamber 14 by inserting a finger or a finger-like tool into an open end of the tube to force the segment back out of an opening 38 in the tube periphery when the articles 22 are to be dispensed from that open end of the tube. As the tube cross section is not crushed out of its original shape in forming the segments and as the segment ends are slightly elongated in being formed, the segments are easily pushed back out of the tubular chamber 14 with assurance that they will remain outside the chamber and permit free flow of the articles 22 from the open tube end into automatic socket mounting equipment and the like. In that way, the novel and improved package 10 is characterized by low cost in material, loading and unloading; is reliable in providing protection for the sockets 22 during shipment; and permits subsequent reliable and free unloading of the sockets from the tubular package.

It should be understood that although particular embodiments of the invention have been described above by way of illustrating the invention, the invention includes all modifications and equivalents of the disclosed embodiments falling within the scope of the appended claims.

We claim:

1. A shipping and dispensing package comprising a shape-retaining open-ended tube of synthetic plastic material having a tube periphery of an original configuration with a cross-section conforming to a lateral outline of an article to define a tubular package chamber of corresponding cross-section for receiving a series of such articles in side-by-side relation to each other to permit the articles to be shipped in the tube and to be subsequently fed sequentially from an open end of the tube, characterized in that at least one integral segment of the tube material extending around part of the tube periphery adjacent to and spaced from at least one end of the tube is separated from the tube material along two opposite sides of the segment, the opposite ends of the segment are integrally connected with the tube material at locations spaced from each other at facing opposite sides of the tube periphery, and the integral segment is deformed out of the original configuration of the tube periphery to leave an opening in the tube periphery and to extend across the tubular chamber between said opposite sides of the tube periphery with one of said sides of the segment disposed for intercepting articles to be fed from the chamber through said open tube end and with the width of the segment oriented generally parallel to the axis of the tubular chamber for supporting said one side of the segment and positively blocking feeding of articles from said open tube and, the synthetic plastic material in the segment at the ends of the segment being deformed beyond the elastic limit of the material for elongating the segment end portions so that the segment inclines down into the chamber from said facing opposite sides of the tube periphery and extends across a selected portion of the tubular chamber so that movement of the segment back into said opening due to material memory is substantially retarded, the segment being movable radially outward from the tubular chamber into said opening by use of a tool for selectively permitting free feeding of articles from said open tube end.

2. A shipping and dispensing package as set forth in claim 1 further characterized in that said segment end portions are hingedly connected to respective support portions of the tube periphery at hinge locations adjacent the respective segment ends so that the segment end portions extend in one direction into the tubular package chamber and said adjacent support portions of the tube periphery extend in an opposite direction to provide substantially columnar support for the segment ends at said hinge locations so that, when the material of the segment end portions is deformed for elongating said end portions by forcible movement of the segment into the tubular chamber against the columnar support provided by said adjacent portions of the tube periphery, the support portions are free of stresses such as might cause spring back of the segment into the tube periphery opening.

3. A shipping and dispensing package as set forth in claim 2 further characterized in that the peripheral tube cross-section comprises two oppositely facing tube sides disposed in rectilinear relation to a third tube side and has a fourth reentrant side opposite the third side forming a channel-shaped strengthening rib extending along the length of the tube to prevent bending or the tube and to provide the tubular package chamber with a cross section for receiving articles of irregular bifurcated outline to rest on the rib with the bifurcations thereof accommodated in suspended and protected relation in the chamber on respective opposite sides of the rib, in that one of said segments is provided adjacent each end of the tube for releasibly retaining articles within the package chamber and in that each of said segments embodies portions of said two sides and said third side so that said two sides provide said columnar support for the segment and the segment is disposed to extend across a part of the chamber near the central axis of the chamber.

4. A shipping, and dispensing package as set forth in claim 3 further characterized in that said segment extends into said chamber and disposes said one edge relatively closer to said rib then the opposite segment edge for more positively blocking feeding or articles from the open tube end.

* * * * *